(12) United States Patent
Mishima

(10) Patent No.: US 9,054,399 B2
(45) Date of Patent: Jun. 9, 2015

(54) COOLING DEVICE OF VEHICLE BATTERY

(75) Inventor: Jun Mishima, Shizuoka-Ken (JP)

(73) Assignee: SUZUKI MOTOR CORPORATION, Hamamatsu-shi, Shizuoka-Ken (JP)

( * ) Notice: Subject to any disclaimer, the term of this patent is extended or adjusted under 35 U.S.C. 154(b) by 316 days.

(21) Appl. No.: 13/697,129

(22) PCT Filed: May 9, 2011

(86) PCT No.: PCT/JP2011/060631
§ 371 (c)(1),
(2), (4) Date: Nov. 9, 2012

(87) PCT Pub. No.: WO2011/142304
PCT Pub. Date: Nov. 17, 2011

(65) Prior Publication Data
US 2013/0065099 A1    Mar. 14, 2013

(30) Foreign Application Priority Data
May 11, 2010    (JP) .................................. 2010-108937

(51) Int. Cl.
| H01M 10/50 | (2006.01) |
| H01M 10/613 | (2014.01) |
| B60K 1/04 | (2006.01) |
| B60L 11/18 | (2006.01) |
| H01M 10/625 | (2014.01) |
| H01M 10/6561 | (2014.01) |
| H01M 10/6566 | (2014.01) |
| H05K 7/20 | (2006.01) |
| B60K 1/00 | (2006.01) |

(52) U.S. Cl.
CPC ............ H01M 10/5004 (2013.01); B60K 1/04 (2013.01); *B60K 2001/005* (2013.01); *B60K 2001/0416* (2013.01); B60L 11/1874 (2013.01); H01M 10/5016 (2013.01); H01M 10/5063 (2013.01); H01M 10/5073 (2013.01); H05K 7/20863 (2013.01); *Y02T 10/7005* (2013.01); *Y02T 10/705* (2013.01); *Y02T 90/16* (2013.01)

(58) Field of Classification Search
CPC ................... H01M 10/5016; H01M 10/5057; H01M 2/0237; H01M 10/50
USPC .......................................... 429/120; 180/68.1
See application file for complete search history.

(56) References Cited

U.S. PATENT DOCUMENTS

2009/0152031 A1*    6/2009    Lim ............................. 180/68.1

FOREIGN PATENT DOCUMENTS

| JP | 6256306 | 4/1987 |
| JP | 2000088145 A | 3/2000 |

(Continued)

OTHER PUBLICATIONS

English Translation of International Preliminary Report on Patentability, PCT/JP2011/060631 filed May 9, 2011.

(Continued)

*Primary Examiner* — Kenneth Douyette
*Assistant Examiner* — James Lee
(74) *Attorney, Agent, or Firm* — Barnes & Thornburg LLP

(57) ABSTRACT

A vehicle battery cooling device including a battery case containing a battery for generating a high voltage and disposed in a space between a pair of right and left side panels at a rear side of a vehicle, a cooling fan disposed at a location overlapping the battery case in a vertical direction of the vehicle and configured to send cooling air to the battery case, and a duct placed in a space between the battery case and the side panels in a width direction of the vehicle so as to communicate the cooling fan and the battery case with each other. The duct is fastened to the battery case via a bracket, the bracket has an inner space having a U-shaped cross section, and the duct is disposed inside the inner space.

4 Claims, 7 Drawing Sheets

(56) References Cited

FOREIGN PATENT DOCUMENTS

| | | | |
|---|---|---|---|
| JP | 2004161058 A | 6/2004 | |
| JP | 2004327142 A | 11/2004 | |
| JP | 2005071759 A | 3/2005 | |
| JP | 2009087738 A | 4/2009 | |
| JP | 2009129730 A | 6/2009 | |

OTHER PUBLICATIONS

Search Report for International Patent Application No. PCT/JP2011/060631; Aug. 16, 2011.

\* cited by examiner

COOLING DEVICE OF VEHICLE BATTERY

PRIORITY CLAIM

This patent application is a U.S. National Phase of International Patent Application No. PCT/JP2011/060631, filed 9 May 2011, which claims priority to Japanese Patent Application No. 2010-108937, filed 11 May 2010, the disclosures of which are incorporated herein by reference in their entirety.

TECHNICAL FIELD

The present invention relates to a cooling device of a vehicle battery, and more particularly, to a vehicle battery cooling device which protects a duct for feeding cooling air to a vehicle battery and makes effective use of space around the duct.

BACKGROUND ART

In vehicles, such as electric cars and hybrid cars, which are driven by a motor, since batteries for driving vehicles are heated (become hot) by power generation, it is necessary for the batteries to be cooled, and because of this purpose, the batteries are cooled by feeding cooling air by a cooling device.

Conventional vehicle battery cooling devices include one, such as described in Patent Document 1, in which a battery case is disposed in a space between a pair of right and left side panels in rear portion of a vehicle while a duct which communicates a cooling fan and the battery case with each other is disposed in a space between the battery case and side panels in a width direction of the vehicle.

PRIOR ART DOCUMENTS

Patent Document

Patent Document 1: Japanese Patent Laid-Open Publication No. 2005-71759

DISCLOSURE OF THE INVENTION

Problems to be Solved by the Invention

However, as in the case of Patent Document 1, when the duct is placed at a location between the battery case and side panels in the width direction of the vehicle in the rear portion of the vehicle and other in-vehicle components are mounted around the duct, the in-vehicle components might hit the duct during assembly of the in-vehicle components, thereby causing the duct to come off the battery case.

Furthermore, in a case if it goes unnoticed that the duct has come off from the battery case, the cooling air can no longer be sent from the cooling fan to the battery case through the duct, making it impossible to cool the battery in the battery case sufficiently.

Furthermore, in order to prevent the duct from coming off from the battery case, if in-vehicle components are avoided from being placed or mounted in a space around the duct to prevent the duct from coming off the battery case, the flexibility of component layout around the duct will be reduced, thus being inconvenient.

An object of the present invention, to solve the problems encountered in the conventional technique described above, is to provide a vehicle battery cooling device capable of protecting the duct from contacting with other in-vehicle components and making it possible to effectively use space around the duct at a time when cooling air is sent to a battery case containing a high-voltage generating battery from a cooling fan through a duct during cooling of the vehicle battery.

Means for Solving the Problems

To achieve the above object, an embodiment of the present invention provides a vehicle battery cooling device comprising: a battery case that contains a battery for generating a high voltage and disposed in a space between a pair of right and left side panels at a rear side of a vehicle; a cooling fan disposed at a location overlapping the battery case in a vertical direction of the vehicle and configured to send cooling air to the battery case; and a duct placed in a space between the battery case and the side panels in a width direction of the vehicle so as to communicate the cooling fan and the battery case with each other, wherein the duct is fastened to the battery case via a bracket, the bracket has an inner space having a U-shaped cross section, and the duct is disposed inside the inner space.

In addition, a more preferable embodiment of the present invention may take the following modes.

It may be desired that the cooling fan is placed above the battery case, the duct is extended downward from the cooling fan, and at least at a portion of the duct which passes a side portion of the battery case, as viewed from a side of the vehicle, a transverse section of the duct is formed to have a section flattened in a longitudinal direction of the vehicle.

Furthermore, with the duct being disposed inside the bracket, a predetermined gap may be formed between a front wall of the duct and a front wall of the bracket opposing to the front wall of the duct, and a predetermined gap may be also formed between a rear wall of the duct and a rear wall of the bracket opposing to the front wall of the duct, relative to the longitudinal direction of the vehicle.

Further, a burring hole may be formed in at least one of the front and rear walls of the bracket relative to the direction of the vehicle.

Furthermore, as seen from a side of the vehicle, a bulging portion may be formed in an upstream side of the duct so as to protrude forward of the vehicle or a rearward of the vehicle than in a downstream side of the duct, and an extending portion may be formed on the bracket so as to cover a lower surface of the bulging portion.

Effects of the Invention

According to the vehicle battery cooling device according to the embodiment of the present invention having the features described above, the duct can be fastened to the battery case via the bracket having a U-shaped inner space so as to dispose the duct therein, and hence, when other in-vehicle components are mounted around the duct, the bracket can fasten the duct to the battery case and a vehicle body and protect the duct from contacting with in-vehicle components, making it possible to prevent the duct from coming off from the battery case or cooling fan.

Therefore, the vehicle battery cooling device according to the present invention allows the in-vehicle components to be placed near the duct, thereby enabling effective use of the space around the duct.

Furthermore, more detailed configuration and features according to the embodiment of the present invention will become more apparent from the following description made with reference to the accompanying drawings.

EMBODIMENT FOR CARRYING OUT THE INVENTION

In a vehicle battery cooling device according to the present invention, a bracket fastening a duct is configured to have a U-shaped cross section, and the duct is placed inside the bracket to thereby protect the duct from contact with in-vehicle components and prevent the duct from coming off from the battery case or cooling fan.

Hereunder, embodiments of the present invention will be described with reference to the accompanying drawings. It is to be noted that, in the description, terms which indicate directions (left/right, forward/backward) are used with reference to the illustration of the drawings or in a normal state for drive of the vehicle.

Embodiments

Figure 1:
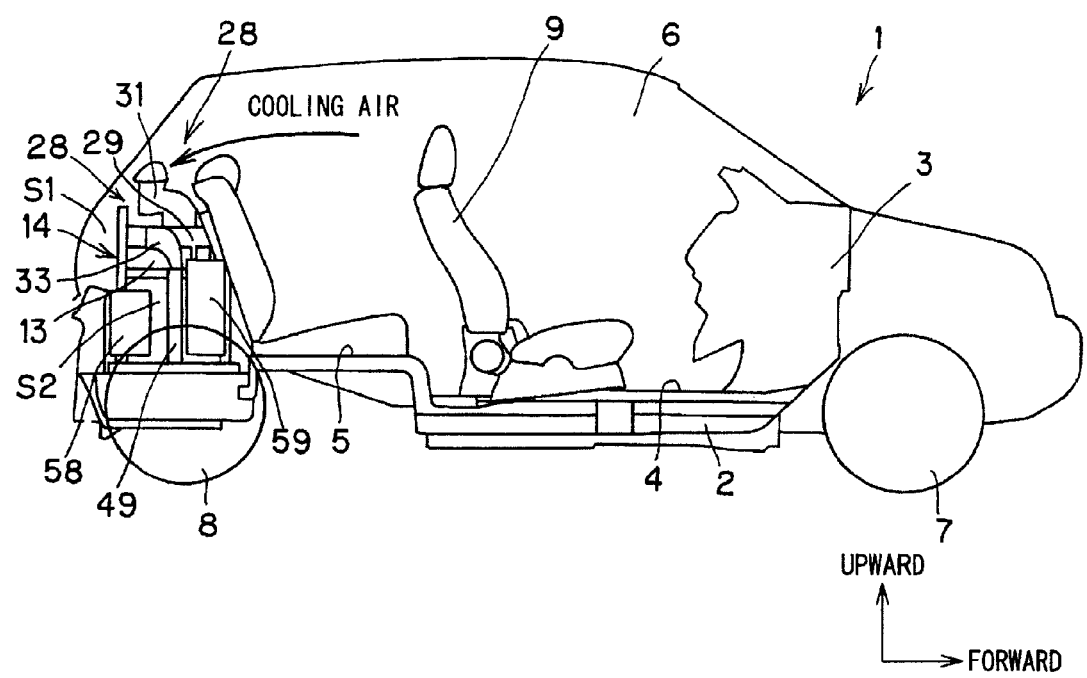
FIG. 1 is an illustrated side view of a vehicle equipped with a vehicle battery cooling device according to an embodiment of the present invention.
Figure 2:
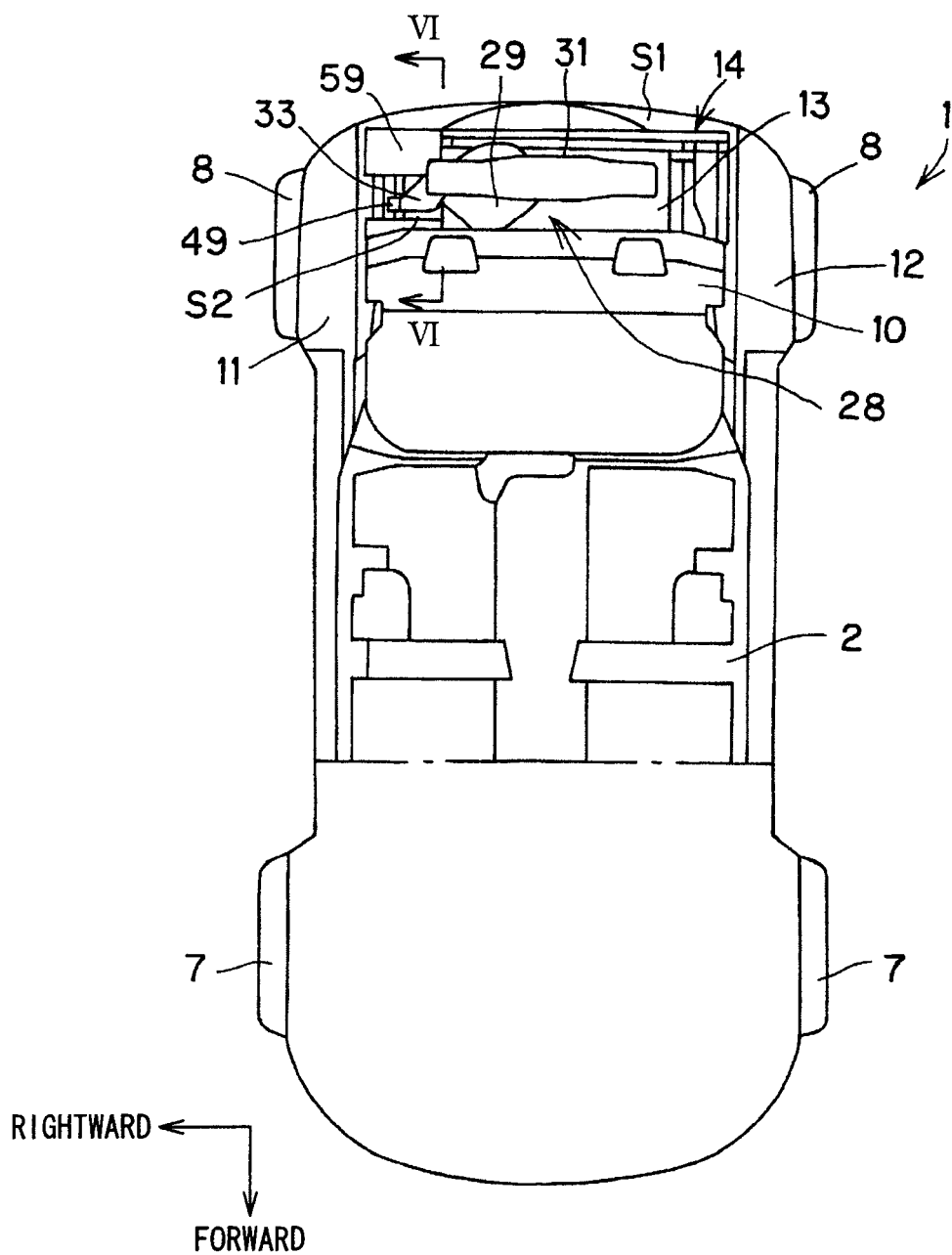
FIG. 2 is an illustrated plan view of the vehicle equipped with the vehicle battery cooling device shown in FIG. 1.

In FIGS. 1 and 2, reference numeral 1 denotes a vehicle such as an automobile. The vehicle 1 includes a body frame 2, a dash panel 3, a front floor 4, a rear floor 5, a cabin 6, front wheels 7, rear wheels 8, and the like.

That is, in the vehicle 1, a front seat 9 is disposed on the front floor 4 of the cabin 6, a rear seat 10 is disposed on the rear floor 5 of the cabin 6. Further, a battery case 13 containing a battery for generating a high voltage to travel the vehicle is disposed in a space (luggage compartment) S1 between a pair of right and left side panels 11 and 12 disposed on the rear floor 5 behind the rear seat 10. The battery case 13 is supported by a supporting frame 14 mounted on the rear floor 5.

Figure 3:
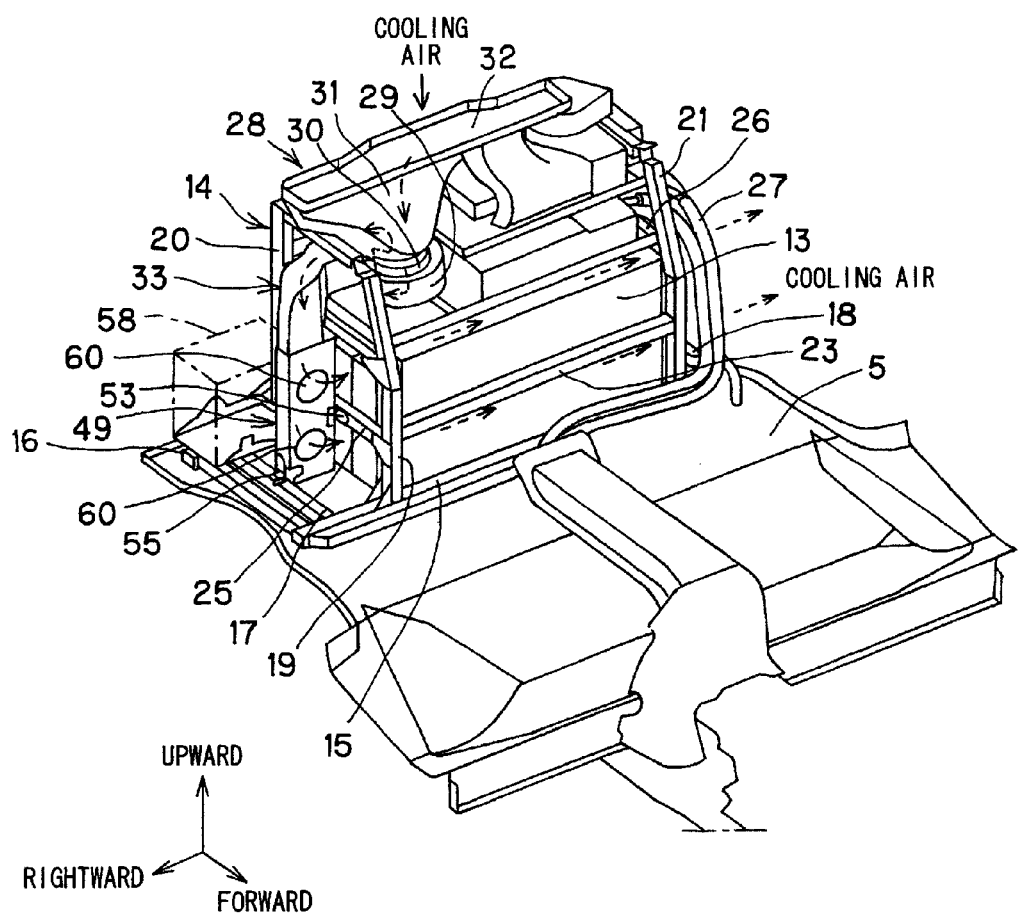
FIG. 3 is a perspective view of the battery cooling device mounted on the vehicle shown in FIGS. 1 and 2, as viewed from the right front side of the vehicle.
Figure 4:
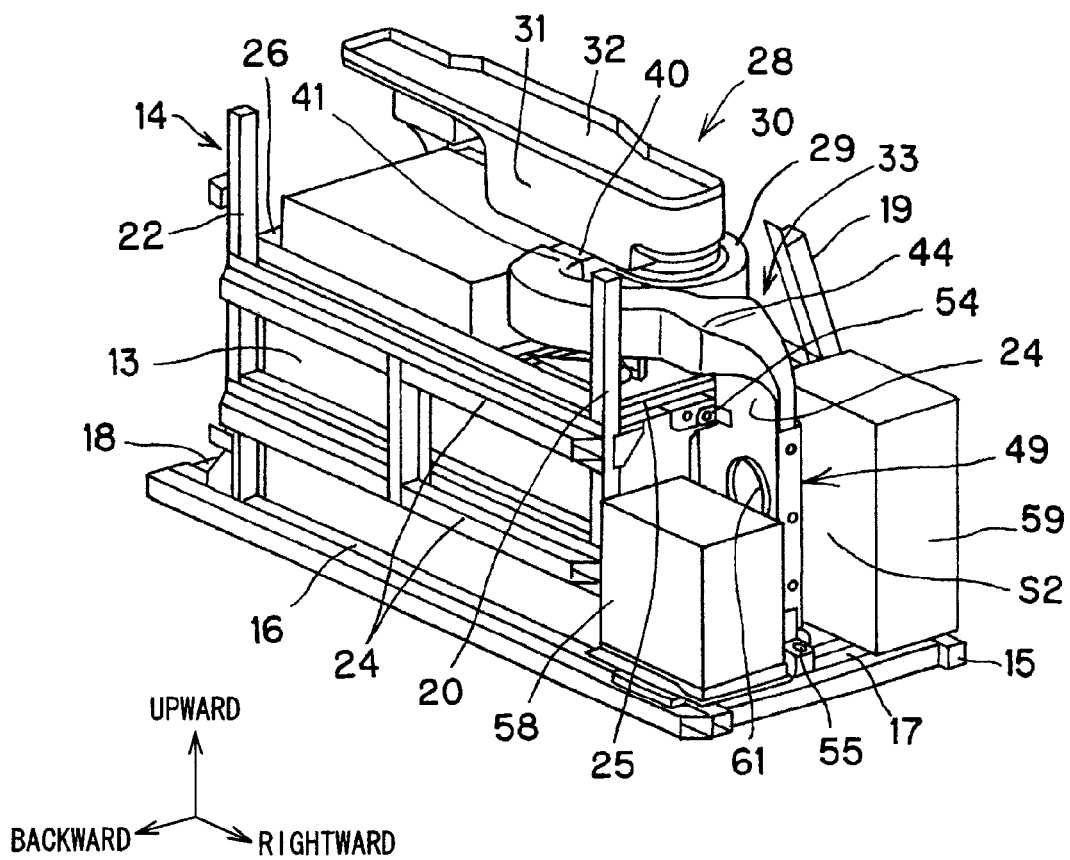
FIG. 4 is a perspective view of the vehicle battery cooling device, as viewed from the right rear side of the vehicle.
Figure 5:
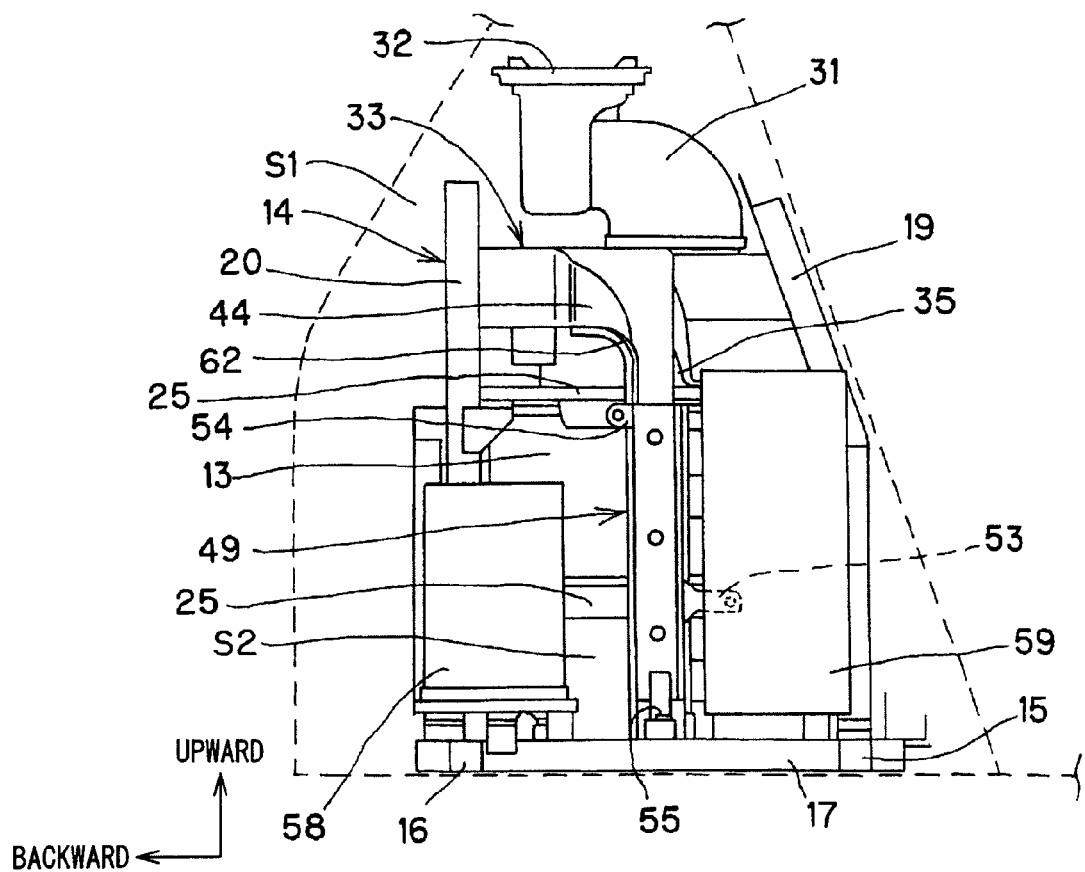
FIG. 5 is a right side view of the vehicle battery cooling device.

As shown in FIGS. 3 to 5, the supporting frame 14 is configured in the manner such that: two chassis members, i.e., a front chassis member (base member) 15 and a rear chassis member (base member) 16, extending parallel to a width direction of the vehicle by being spaced away from each other in a longitudinal (forward/backward or travelling) direction on the rear floor 5 are connected with each other at opposite ends in the car width direction, respectively, by a right chassis member (base member) 17 and left chassis member (base member) 18 extending in the longitudinal direction of the vehicle; a right front vertical frame member 19 and right rear vertical frame member 20 are erected so as to stand, respectively, at locations spaced away from right ends of the two chassis members, i.e., the front chassis member 15 and rear chassis member 16, in the vehicle width direction; and a left front vertical frame member 21 and left rear vertical frame member 22 are erected so as to stand, respectively, at locations close to left ends of the two chassis members, i.e., the front chassis member 15 and rear chassis member 16, in the vehicle width direction.

Furthermore, the supporting frame 14 is configured such that two frame members, i.e., the right front vertical frame member 19 and left front vertical frame member 21, erected on the front chassis member 15 are connected by a front link (bridge) member 23 extending in the vehicle width direction, and two frame members, i.e., the right rear vertical frame member 20 and left rear vertical frame member 22 erected on the rear chassis member 16 are connected by a rear link (bridge) member 24 extending in the vehicle width direction.

Moreover, the supporting frame 14 is configured such that two frame members, i.e., the right front vertical frame member 19 and right rear vertical frame member 20, erected at locations spaced away from the right ends of the front chassis member 15 and rear chassis member 16 are connected by a right link (bridge) member 25 extending in the longitudinal direction of the vehicle, and two frame members, i.e., the left front vertical frame member 21 and left rear vertical frame member 22, erected at locations close to the left ends of the front chassis member 15 and rear chassis member 16 are connected by a left link (bridge) member 26 extending in the longitudinal direction of the vehicle.

According to the arrangement and configuration mentioned above, the supporting frame 14 is formed into a rectangular shape with the members 15 to 26 being connected to surround the battery case 13. As shown in FIG. 3, a power line 27 to supply electric power is led out of the battery in the battery case 13 surrounded by the supporting frame 14. In the supporting frame 14, as shown in FIGS. 3 and 4, since right front vertical frame member 19 and right rear vertical frame member 20 are erected, respectively, at locations spaced away from right ends of the two chassis members, i.e., the front chassis member 15 and rear chassis member 16, in the vehicle width direction, a space 2S utilized for mounting components is formed between the two chassis members, namely the right front vertical frame member 19 and right rear vertical frame member 20, and the right side panel 11.

The battery case 13 is provided with a cooling device (or unit) 28 to cool the battery contained in the battery case 13. As shown in FIGS. 3 to 5, the cooling device 28 includes a cooling fan 29 for feeding cooling air and is disposed at a location overlapping the battery case 13 in a vertical direction of the vehicle.

According to the present embodiment, the cooling fan 29 is placed on a right side of the vehicle width direction above the battery case 13. The cooling fan 29 has an intake port 30 at an upper portion thereof and the intake port 30 is communicated with an air intake member 31 extending in the vehicle width direction, and the air intake member 31 is provided with an air intake port 32 opened above and expanded in the vehicle width direction. The intake fan 29 is has an exhaust port at a rear portion thereof to which a duct 33 is connected, the duct 33 then being connected to the battery case 13.

Figure 7:
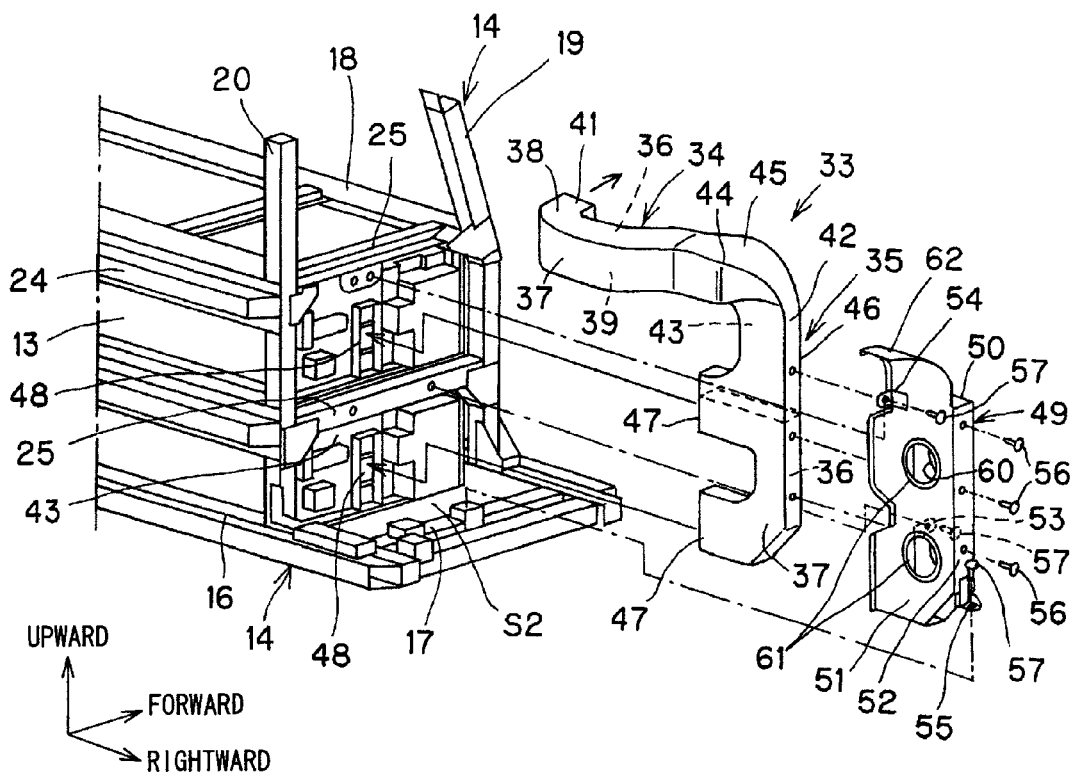
FIG. 7 is an exploded perspective view of the battery cooling device, showing a battery case, duct, and bracket.

The duct 33 communicates between the intake fan 29 and battery case 13 so as to send air taken in from the cabin 6 by the air intake member 31 to the battery case 13 as cooling air to cool the battery contained in the battery case 13. As shown in FIG. 7, the duct 33 is made up of an upper duct portion 34 placed above the battery case 13 and a side duct portion 35 which is placed on the right side of the battery case to be continuous with the upper duct portion 34.

The upper duct portion 34 has a rectangular longitudinal section in which a front wall surface 36 and a rear wall surface 37 substantially parallel to each other intersect an upper wall surface 38 and lower wall surface 39 substantially parallel to each other in a substantially perpendicular manner. The upper duct portion 34 curves gradually from the right side to the oblique right forward side while extending toward the rear side of the vehicle body from a rear side of the intake fan 29 and then curves again rightward. An upstream end of the upper duct portion 34 is opened toward the front side of the vehicle body and is provided with a cooling air inlet 41 connected to an exhaust port 40 of the intake fan 29.

The side duct portion 35 is configured such that the front wall surface 36 extends obliquely to the right front side, then to the right side, and then downward, and on the other hand, the rear wall surface 37 extends to the right side, then extends obliquely to the right front side, curves, and is then joined to the lower wall surface 39. Further, the upper wall surface 38 extends to the right side, and then curves downward, constituting a right wall surface 42, and extends downward while the lower wall surface 39 extends to the right side, and then curves, constituting a left wall surface 43, and extends downward. The lower wall surface 39 partially constitutes the rear wall surface 37 which extends downward.

Furthermore, in the side duct portion 35, the front wall surface 36 extending downward and the rear wall surface 37 approach each other, and on the other hand, the right wall surface 42 following the upper wall surface 38 bent downward is spaced away from the left wall surface 43 following the lower wall surface 39. Then, with a transverse section narrowed into a shape flattened in the longitudinal direction of the vehicle, the side duct portion 35 extends toward the lower side of the vehicle along the left wall surface 43 of the battery case 13 down to the lower side of the battery case 13 by passing through an intermediate portion of the space 2S in the longitudinal direction of the vehicle between the battery case 13 and right side panel 11.

According to the structure mentioned above, as viewed from a side of the vehicle, the side duct portion 35 has a bulging portion 44 formed in an upstream side continuing from the upper duct portion 34. The bulging portion bulges out further forward of the vehicle or rearward of the vehicle than the downstream side (bulging out toward the rear side of the vehicle, according to the present embodiment). Further, the side duct portion 35 is provided with the front wall surface 36 extending obliquely to the right front side and then to the right side to thereby form a bulging portion 45 which bulges out forward of the vehicle, but the bulging portion 45 does not protrude over the downstream side.

Furthermore, a flat portion 46 with a sectional shape elongated in the width direction of the vehicle is formed in that part of the lateral duct portion 35 which passes a right lateral side of the battery case 13. In the lateral duct portion 35, a cooling air outlet 47 is provided in the left wall surface 43 which forms a flat portion 46, opening in a left direction of the vehicle. The cooling air outlet 47 is connected to a cooling air introduction port 48 formed in the right flank of the battery case 13.

The cooling device 28 described hereinbefore is provided with a bracket 49 adapted to fasten the battery case 13 to the duct 33. The bracket 49 is a member configured to have a U-shaped cross-section defined by a front wall 50 and a rear wall 51, which are parallel in the longitudinal direction of the vehicle and extends in a vertical direction, and a right wall 52 which extends in the vertical direction of the vehicle so as to connect respective right edges of the front wall 50 and the rear wall 51.

Figure 6:
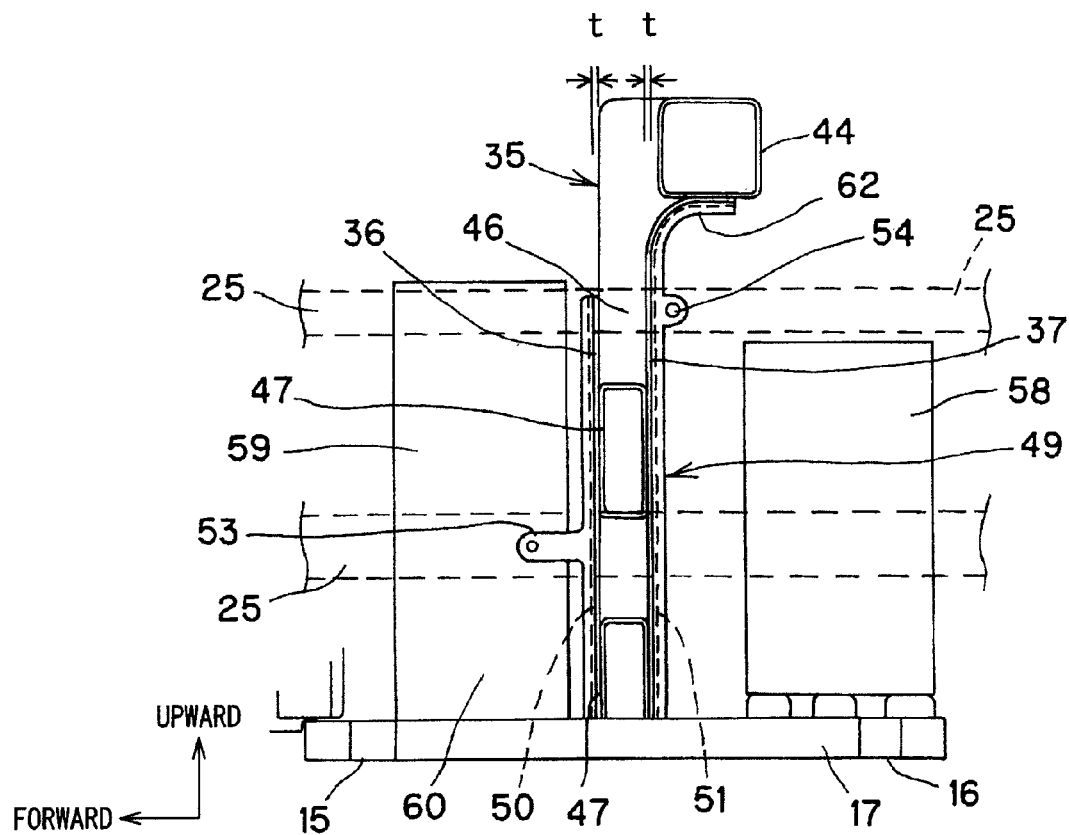
FIG. 6 is an arrow view taken along line VI-VI in FIG. 2.

The side duct portion 35 of the duct 33 is disposed inside the U-shaped cross sectional portion of the bracket 49. Further, as shown in FIG. 6, under the state in which the flat portion 46 of the side duct portion 35 is disposed inside the U-shaped cross section of the bracket 49, the bracket 49 has a predetermined gap (with a width of t) is formed between a front side wall 36 of the side duct portion 35 and a front side wall 50 of the bracket 49, opposing to the front side wall of the duct in the vehicle longitudinal direction and a predetermined gap (t) between a rear side wall 37 of the side duct portion 35 and a rear side wall 51 of the bracket 49, opposing to the rear side wall of the duct in the vehicle longitudinal direction.

Furthermore, as shown in FIG. 7, the bracket 49 is provided with a front-side mounting portion 53 installed in the intermediate portion of the front wall 50, a rear-side mounting portion 54 installed in upper portion of the rear wall 51, and a right-side mounting portion 55 installed in the lower portion of the right wall 52.

Furthermore, in the bracket 49, the right wall 52 thereof is mounted on the right wall surface 42 of the side duct portion 35 by means of fittings 56. Then, under the state in which the predetermined gaps (t) are formed as mentioned above, the front-side mounting portion 53 and the rear-side mounting portion 54 of the bracket 49 are fastened to the right link (bridge) member 25 of the supporting frame 14 by means of fixture 57 and the right-side mounting portion 55 of the bracket 49 is fastened to a right chassis member 17 of the supporting frame 14 by means of the fixture 57.

According to configuration and arrangement described above, in the duct 33, the side duct portion 35 located in the intermediate portion of the space 2S, in the longitudinal direction of the vehicle, interposed between the battery case 13 and the right side panel 11 is fastened to the battery case 13 supported by the supporting frame 14 via the bracket 49. The space 2S in which the side duct portion 35 is placed includes spaces for use to mount other in-vehicle components including a battery 58 for accessories and a storage box 59 on the front and rear sides of the side duct portion 35 having flat portions in a transverse section in the longitudinal direction of the vehicle.

Furthermore, the bracket 49 has burring holes 60 and 61 formed in the front wall 50 or rear wall 51 relative to the longitudinal direction of the vehicle. Furthermore, as viewed from a side of the vehicle, the bracket 49 has an extending portion 62 formed on an upper end of the rear wall 51 so as to cover an undersurface of the bulging portion 44 formed in upstream side of the duct 33 by bulging out toward the rear side of the vehicle.

According to the cooling device 28 which is configured as described above, since the duct 33 is fastened to the battery case 13 supported by the supporting frame 14 via the bracket 49 and the bracket 49 is configured to have a U-shaped cross section, inside which the side duct portion 35 of the duct 33 is placed, at a time when other in-vehicle components are mounted around the lateral duct portion 35 of the duct 33, the bracket 49 can fasten the duct 33 to the battery case 13 and protect the duct 33 from contacting with the in-vehicle components including the battery 58 for accessories and the storage box 59, thus preventing the duct 33 from coming off the battery case 13 or cooling fan 29.

According to the arrangement described above, the vehicle battery cooling device 28 allows the in-vehicle components to be placed near the duct 33, thus enabling effective use of the space S2 around the duct 33.

Further, the cooling fan 29 of the vehicle battery cooling device 28 is disposed above the battery case 13, the duct 33 is extended downward from the cooling fan 29 along the side portion of the battery case 13, and as seen in a side view of the vehicle, a the side duct portion 35 of a part passing along the side of the battery case 13 has a transverse surface having a section flattened in the longitudinal direction of the vehicle.

Furthermore, in the vehicle battery cooling device 28, since the transverse section of the part of the duct 33 which passes the lateral side of the battery case 13 is formed into a section flattened in the longitudinal direction of the vehicle, the space occupied by the duct 33 can be reduced in the space S2 formed on the side of the battery case 13. However, when the transverse section of the duct 33 is flattened in the longitudinal direction of the vehicle as described above, the duct 33 becomes prone to coming off from the battery case 13 if contacted by the in-vehicle components when the in-vehicle components are mounted near the duct 33.

In order to cope with the above defect, in the vehicle battery cooling device 28 according to the present embodiment, the bracket 49 is mounted in such a way as to cover the duct 33 with a transverse section flattened in the longitudinal direction of the vehicle, making it possible to protect the duct 33 from contacting with the in-vehicle components even if the duct 33 is shaped as described above and prevent the duct 33 from coming off from the battery case 13.

According to the arrangement mentioned above, according to the vehicle battery cooling device 28 of the present embodiment, the space is created in front of and behind the duct 33 to thereby make it possible to place the in-vehicle components in front of and behind the duct 33, and the space around the duct 33 can be effectively utilized.

The bracket 49 is configured such that the bracket 49 has a predetermined gap (with a width of t) is formed between a front side wall 36 of the side duct portion 35 and a front side wall 50 of the bracket 49, opposing to the front side wall of the duct in the vehicle longitudinal direction and a predetermined gap (t) between a rear side wall 37 of the side duct portion 35 and a rear side wall 51 of the bracket 49, opposing to the rear side wall of the duct in the vehicle longitudinal direction, with the lateral duct portion 35 being disposed in the U-shaped inside portion.

Accordingly, in the vehicle battery cooling device 28, when the in-vehicle components are mounted in front of and behind the side duct portion 35 of the duct 33, even if the in-vehicle components contact the bracket 49, since the gap (t) is formed to permit displacement (deformation) of the bracket 49, the bracket 49 and duct 33 can be avoided from contacting with each other. Even in case the bracket 49 contacts the duct 33, the displacement and deformation of the bracket 49 will lighten loads applied to the duct 33, thus preventing the duct 33 from coming off from the battery case 13 or cooling fan 29.

In the above-described vehicle battery cooling device 28 according to the present embodiment, since the burring holes 60 and 61 are formed in at least one of the front wall 50 and rear wall 51 (both the front wall 50 and rear wall 51, according to the present embodiment) of the bracket 49 relative to the direction of the vehicle, the surface rigidity and torsional rigidity of wall surfaces of the bracket 49 can be improved in comparison with a case of the wall surfaces being flat.

Furthermore, in the vehicle battery cooling device 28, when the in-vehicle components are mounted in front of and behind the duct 33, even if the in-vehicle components contact the bracket 49, the improved surface rigidity and torsional rigidity can reduce the amounts of displacement or deformation of the front wall 50 or rear wall 51 of the bracket 49, thus making it possible to restrain the bracket 49 from contacting the duct 33 and protect the duct 33 from the in-vehicle components.

Still furthermore, in the vehicle battery cooling device 28 according to the present embodiment, as viewed from a side of the vehicle, the duct 33 has a bulging portion 44 formed in the upstream side thereof, the bulging portion protruding further toward the rear side of the vehicle than downstream side, and the bracket 49 is formed with an extending portion 62 formed so as to cover the lower surface of the bulging portion 44, and accordingly, when the in-vehicle components are mounted below the bulging portion 44 of the duct 33, the extending portion 62 of the bracket 49 can prevent the upper portion of the in-vehicle components from directly contacting the bulging portion 44 of the duct 33.

According to the structure and/or arrangement described above, in the vehicle battery cooling device 28, the extending portion 62 of the bracket 49 can prevent the duct 33 from coming off from the cooling fan 29, thereby protecting the duct 33.

INDUSTRIAL APPLICABILITY

The present invention with the above-described embodiment provides a vehicle battery cooling device which feeds cooling air to a battery case from a cooling fan through a duct. The vehicle battery cooling device can protect the duct from contacting other in-vehicle components and make effective use of space around the duct. In addition, the present invention is applicable not only to cooling devices, but also to effective use of space around in-vehicle components.

REFERENCE NUMERALS

1 - - - vehicle
5 - - - rear floor
6 - - - cabin
11 - - - right side panel
12 - - - left side panel
13 - - - battery case
14 - - - support frame
28 - - - cooling device
29 - - - cooling fan
30 - - - intake member
31 - - - intake port
33 - - - duct
34 - - - upper duct portion
35 - - - side duct portion
36 - - - front side wall
37 - - - rear side wall
44 - - - rear side bulging portion
46 - - - flat portion
49 - - - bracket
50 - - - front side wall
51 - - - rear side wall
52 - - - right side wall
62 - - - extending portion

The invention claimed is:

1. A vehicle battery cooling device comprising:
a battery case that contains a battery for generating a high voltage and disposed in a space between a pair of right and left side panels at a rear side of a vehicle;
a cooling fan disposed at a location overlapping the battery case in a vertical direction of the vehicle and configured to send cooling air to the battery case; and
a duct placed in a space between the battery case and the side panels in a width direction of the vehicle so as to communicate the cooling fan and the battery case with each other, wherein
the duct is fastened to the battery case via a bracket, the bracket has an inner space having a U-shaped cross section, and the duct is disposed inside the inner space, and with the duct being disposed inside the bracket and includes a side duct portion, a predetermined gap is formed between a front side wall of the side duct portion and a front side wall of the bracket, opposing the front side wall of the duct in the vehicle longitudinal direction, and a predetermined gap is also formed between a rear side wall of the side duct portion and a rear side wall of the bracket, opposing to the rear side wall of the duct in the vehicle longitudinal direction.

2. The vehicle battery cooling device according to claim 1, wherein the cooling fan is placed above the battery case, the duct is extended downward from the cooling fan, and at least a portion of the duct passes a side portion of the battery case, as seen from a side of the vehicle, a transverse section of the duct is formed to have a section flattened in a longitudinal direction of the vehicle such that a dimension in the vehicle width direction is longer than a dimension in a length direction of the vehicle.

3. The vehicle battery cooling device according to claim 1, wherein a burring hole is formed in at least one of the front and rear walls of the bracket relative to the vehicle longitudinal direction.

4. The vehicle battery cooling device according to claim 3, wherein, as viewed from a side of the vehicle, a bulging portion is formed in an upstream side of the duct so as to protrude forward or rearward of the vehicle than in a downstream side of the duct, and an extending portion is formed on the bracket so as to cover a lower surface of the bulging portion.

* * * * *